(12) United States Patent
Kim et al.

(10) Patent No.: US 7,569,469 B2
(45) Date of Patent: Aug. 4, 2009

(54) DIELECTRIC NANOSTRUCTURE AND METHOD FOR ITS MANUFACTURE

(75) Inventors: Ho-Cheol Kim, San Jose, CA (US); Robert D. Miller, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/499,132

(22) Filed: Aug. 3, 2006

(65) Prior Publication Data
US 2009/0170342 A1   Jul. 2, 2009

(51) Int. Cl.
H01L 21/44 (2006.01)
(52) U.S. Cl. .............. 438/597; 438/584; 438/781; 257/E21.001; 257/E21.062; 977/700
(58) Field of Classification Search .......... 438/597, 438/781, 584; 257/E21.001, E21.062, 648; 977/700
See application file for complete search history.

(56) References Cited

U.S. PATENT DOCUMENTS

| | | | |
|---|---|---|---|
| 6,399,666 B1 | 6/2002 | Hawker | |
| 6,905,955 B2 | 6/2005 | Basceri | |
| 6,930,034 B2 | 8/2005 | Colburn et al. | |
| 7,056,840 B2 * | 6/2006 | Miller et al. | 438/781 |
| 7,341,788 B2 | 3/2008 | Cha | |
| 2003/0185741 A1 | 10/2003 | Matyjaszewski | |
| 2003/0207595 A1* | 11/2003 | Ralamasu et al. | 438/781 |
| 2004/0152293 A1 | 8/2004 | Basceri et al. | |
| 2004/0232552 A1 | 11/2004 | Wang et al. | |
| 2005/0079719 A1 | 4/2005 | Colburn et al. | |
| 2005/0116346 A1 | 6/2005 | Kirner et al. | |
| 2007/0023870 A1* | 2/2007 | Dubois et al. | 257/642 |

OTHER PUBLICATIONS

Freer et. al. Oriented Mesoporous Organosilicate Thin Films Nano Letters vol. 5, No. 10 2014-2018 (2005).

* cited by examiner

Primary Examiner—Alexander G Ghyka
Assistant Examiner—Abdulfattah Mustapha
(74) Attorney, Agent, or Firm—Dan Johnson; Robert Martin

(57) ABSTRACT

The present invention relates to dielectric nanostructures useful in semiconductor devices and other electronic devices and methods for manufacturing the dielectric nanostructures. The nanostructures generally comprises an array of isolated pillars positioned on a substrate. The methods of the present invention involve using semiconductor technology to manufacture the nanostructures from a mixture of a crosslinkable dielectric material and an amphiphilic block copolymer.

8 Claims, 3 Drawing Sheets

TEM Images  Diblock Copolymer  +

PS-b-PEO, 32k-2k
Block Copolymer/SSQ = 75/25

Posts with ~32 nm

DIELECTRIC NANOSTRUCTURE AND METHOD FOR ITS MANUFACTURE

TECHNICAL FIELD

The invention relates to dielectric nanostructures useful in semiconductor devices and other electronic devices and methods for manufacturing the dielectric nanostructures.

BACKGROUND

Semiconductor devices such as microprocessors, microcontrollers and communication chips are used extensively in electronic devices including computers. Generally semiconductor devices include a plurality of integrated circuits (ICs). ICs can contain millions of transistors and other circuit elements fabricated on a single semiconductor chip. For device functionality, numerous circuit lines will typically be routed to connect the circuit elements distributed on the surface of the semiconductor device. Efficient routing of the electrical signals can become more difficult as the number and complexity of the ICs increases. Multilevel or multilayered interconnect circuit lines are used to provide efficacy in providing high-speed signal routing patterns between a large number of transistors on the semiconductor chip.

Back-end-of-the line (BEOL) wiring interconnects are prepared on IC chips by a complex combination of lithography, etching, ashing, hard mask and possibly etchstop deposition, liner and metal deposition, chemical mechanical polishing, cleaning, etc. This integration is extraordinarily demanding and expensive. For utilization of copper metallurgy, lithographic images over a planar dielectric are developed and transferred by etching. After metal overdeposition, the excess metal is removed by chemical mechanical polishing (CMP). This procedure is followed for the formation of all of the metal lines in each dielectric layer and the vias which connect the various wiring layers. If the lines and vias are generated in separate processes, this is called a single damascene (SD) processes. If both the line and the vias are processed simultaneously, the process is called dual damascene (DD).

With the ever-growing demand for higher performance at lower cost, the feature dimensions of integrated circuits continue to shrink. As a consequence, there is an increase in the interconnect (RC) delay and signal degradation at the BEOL wiring of semiconductor chips.

In order to reduce the capacitance, conventional insulating materials such as $SiO_2$ are being replaced with dielectric materials that have a lower dielectric constant (low-k). Since $SiO_2$ has a dielectric constant of ~4.0, low-k materials should have k values substantially less than this. The lower dielectric constant materials improve chip performance by mitigating signal delay and decreasing power consumption. The materials currently used in the 90 nm technology node are organosilicates deposited either by spin-on or CVD techniques These materials have a dielectric constant of <3.0. The dielectric constant of the insulating materials must be further reduced for the 65 nm technology node and further reductions are necessary for future generations of products. Due to the low dielectric constant of air (k=1.01), the decrease in dielectric constant to values below 2.2 can be accomplished by the introduction of porosity in the dielectric materials during the manufacturing process. For this, pore generators (porogens) are often introduced into the dielectric formulation.

Unfortunately, the introduction of porosity into an insulating dielectric layer normally results in a degradation of thermal, electrical and, in particular, mechanical properties. All of this is endured to achieve a decrease in the dielectric constant of the dielectric material. The relentless push to lower dielectric constant makes the eventual use of porous materials inevitable. Porous materials with dielectric constants down to k=2.0 and lower have been described. The porous materials can be organic polymers or inorganic-organic hybrid materials (e.g., organosilicates), although the latter are much more numerous.

The minimum achievable dielectric constant for an insulating medium would be that of air (k=1.01) or other common gases. The replacement therefore of solid layer of insulating material between metal insulating lines with air gaps would deliver the maximum decrease in the dielectric constant. However, the incorporation of air gaps leads to numerous mechanical and thermal issues. The low thermal conductivity of gases makes it more difficult to dissipate power, thereby exacerbating chip heating problems. The second issue is loss of mechanical support for the wiring, capping layers and other necessary structures in the BEOL portion of the chip. In spite of the formal technological difficulties, a number of integration schemes employing air bridges are known.

Colbum US 2005/0079719A1 discloses a damascene process which uses a self assembled, block copolymer layer which is processed to form nano holes in the layer. The layer is then used as a template to transfer a pattern of circular holes into a dielectric layer to form columns of air in the dielectric layer. Unfortunately, with this procedure, there is a limited amount of air that can be introduced into the dielectric layer due to the geometric design of the columns of air in Colburn's template. Further, because Colburn's template comprises an organic polymer, etch selectivity can be limited due to the limited thickness of a film that can be obtained with self assembled polymer films. There still is a need for improved dielectric materials having low k values and suitable electrical and mechanical properties.

SUMMARY OF THE INVENTION

The present invention relates to dielectric structures which can be used in semiconductor devices and methods for making these structures. In one embodiment, the structure generally comprises a substrate and a nanostructure positioned on the substrate. The nanostructure comprises an array of isolated pillars. The pillars comprise a crosslinked dielectric material.

The present invention also relates to methods for forming the structure. One method comprises first coating a film onto a substrate. The film comprises a mixture of (i) an amphiphilic volatilizable block copolymer and (ii) a crosslinkable dielectric material. For a block copolymer comprising two block species, the dielectric material is miscible with one of the block species and essentially immiscible with the other block species. The volume fraction in the mixture of the miscible block species and the dielectric material is about 20% to about 40% of the mixture.

Then, using semiconductor technology, selected portions of the film are removed to expose portions of the underlying substrate. Then, conductive material is deposited on the exposed portions of the substrate. Optionally, a permeable capping layer may be deposited onto the film.

Lastly, the block copolymer is then volatilized to form a porous nanostructure comprising an array of pillars posi-

DETAILED DESCRIPTION

Figure 1:
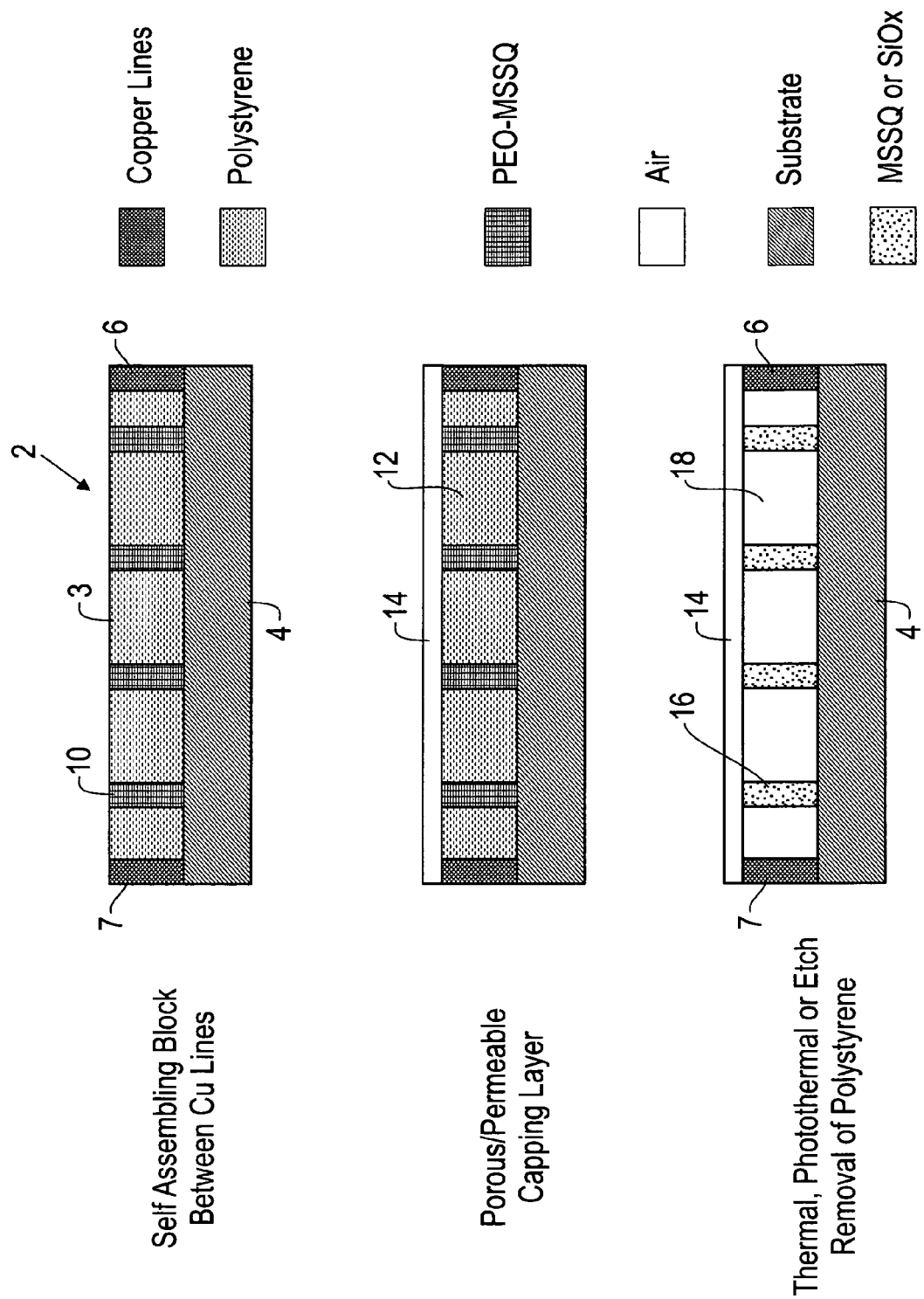
FIG. 1 is a pictorial representation of a method of the present invention.

The present invention relates to dielectric nanostructures and the methods for forming these structures.

As used herein, a nanostructure is a structure comprising elements having dimensions of about 1 nanometer (nm) to about 500 nm.

Alkyl as used herein shall mean branched or unbranched saturated hydrocarbon substituents.

A substrate as used herein is a physical body (e.g., a layer or a laminate, a material, and the like) onto which a polymer or polymeric material may be deposited or to which it adheres. A substrate may include materials of the Group I, II, III, and IV elements; plastic material, silicon dioxide, glass, fused silica, mica, ceramic, or metals deposited on the aforementioned substrates, and the like.

A monomer as used herein is a molecule that can undergo polymerization, thereby contributing constitutional units to the essential structure of a macromolecule, an oligomer, a block, a chain, and the like.

A polymer as used herein is a macromolecule comprising multiple repeating smaller units or molecules (monomers) derived, actually or conceptually, from smaller units or molecules. The term polymer includes oligomers.

A copolymer as used herein is a polymer derived from more than one species of monomer.

A block copolymer as used herein is a copolymer that comprises more than one species of monomer, wherein the monomers are present in blocks. Each block of the monomer comprises repeating sequences of the monomer. A formula representative of a block copolymer comprising several block species is shown below:

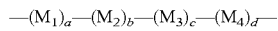

wherein $M_1$, $M_2$, $M_3$, and $M_4$ represent monomer units and the subscripts "a", "b", "c", "d", represent the number of repeating units of $M_1$, $M_2$, $M_3$, and $M_4$ respectively. The above referenced representative formula is not meant to limit the structure of the block copolymer used in an embodiment of the present invention.

Morphology as used herein describes a form, a shape, a structure, and the like of a substance, a material, and the like.

Amphiphilic as used herein is used to describe a polymer that is or has in part polar and non-polar portions that constitute the macromolecule.

In one embodiment of the present invention, the structure comprises a substrate and a nanostructure positioned on the substrate. The nanostructure comprises an array of isolated and discrete pillars. Suitably, the pillars are generally vertically positioned on the substrate. In another embodiment, the structure comprises a substrate, a circuit line positioned on the substrate and a nanostructure contiguous to the circuit line. The nanostructure comprises an array of isolated pillars.

In the structures, the pillars are suitably generally cylindrically shaped and suitably generally vertically positioned. Suitably, the pillars comprise a crosslinked silicon containing dielectric material. Suitably, the pillars generally have a diameter of about 1 nm to about 100 nm.

To form the structures of the present invention, a block copolymer and a crosslinkable dielectric material such as an organosilicate are mixed together. The block copolymer is an amphiphilic, volatilizable copolymer. The copolymer comprises a first and a second block species. The first block species is substantially immiscible with the crosslinkable material and the second block species is generally miscible with the crosslinkable material. Suitable, first block species include polystyrene (PS), poly α-methyl styrene, polynorbonene, polylactones, polylactides, polybutadiene, polyisoprene, polyolefins, and polyisobutylene.

Suitable second block species include poly(alkylene oxide), polyethyleneglycol, polypropylene glycol, polyhydroxyalkylmethacrylate, polyalkyleneoxide acrylates, polyalkyleneoxide methacrylates, carbohydrates, polyvinyl alcohol, polyethyleneimines, polyoxazolines, polypeptides, polyvinylpyridines, acrylamides, and N,N-dimethylacrylamides. Suitable second block species include poly(ethyleneoxide) (PEO) and poly(methyleneoxide)(PMO). A suitable block copolymer is PS-PEO. The block copolymer suitably has a molecular weight of about 2000 to about 300,000 daltons.

The block copolymer is suitably a diblock copolymer comprising two attached polymer segments where one segment (i.e., the first segment), comprising one or more block species (e.g., a homopolymer or copolymer), is miscible with the crosslinkable dielectric material and the other segment (the second segment), also comprising one or more block species (e.g., a homopolymer or a copolymer), is substantially immiscible with the crosslinkable dielectric material. A suitable amphiphilic diblock copolymer [(first block segment)–(second block segment)] comprises one or more first block species and one or more second block species in a two segment diblock morphology such as: $(PS)_a–(PEO)_b$ having only two block species, one in each segment and $(PS)_a–[(PEO)_b+(PMO)_c]$ having only one first block species in the first segment and two second block species in the second segment. In the second segment, the PEO and PMO species can be random or have some ordered morphology.

Suitable crosslinkable dielectric materials include organosilicates, silsesquioxanes, polysilanes, polysilynes, polysilazanes and polycarbosilanes. Suitable organosilicates include organosilicates, such as those disclosed in U.S. Pat. No. 5,895,263 issued Apr. 20, 1999 to Carter et al. (incorporated herein by reference), including the family of organosilicates known as silsesquioxanes, $(RSiO_{1.5})_n$. Suitable silsesquioxanes for the present invention include hydrido (R=H), alkyl (R=methyl, ethyl, propyl, and higher alkyl), aryl (R=phenyl) or alkyl/aryl, vinyl, and copolymers thereof, as well as polymethylsilsesquioxane (PMSSQ), which are commercially available from Owens Corning, JSR Micro and Shin-Etsu, for example. Most commonly, the silsesquioxane is poly (methyl silsesquioxane), $((CH_3)SiO_{1.5})_n$, and n is 10 to 500 or more (including copolymers). As used herein organosilicates include silsesquioxane thermoset resins generally represented by the formula $(RSiO_{1.5})_n$ as described above, including copolymers of one or more of the monomers $(Si(R)O_{1.5})$, $(SiO_2)$, $(SiR_2O)$, and $(SiR SiO_3)$, in which R is defined above. The organosilicate suitably has a molecular weight of about 600 to 30,000 daltons.

The block copolymer and the crosslinkable material are mixed together. Suitably, other ingredients may be added to the mixture including suitable solvents, surfactants, photoacid generators (PAG) and other materials to improve the method and the structure of the present invention. Suitable solvents include PGMEA and propylene glycol propyl ether. Suitable photoacid generators may be any compound that, upon exposure to radiation, generates a strong acid and is compatible with the other components of the mixture. Examples of suitable PAGs include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,731,605.

The block copolymer and crosslinkable material are mixed with any other ingredients in suitable portions so that in the final mixture, the volume fraction (VF) of the second miscible block species and the crosslinkable material is about 20% to about 40% of the total mixture of block copolymer and crosslinkable material and preferably, about 25% to about 35% where $$VF = M_{b2} + M_o / M_{b1} + M_{b2} + M_o$$

where $M_{b1}$ is the number of monomeric repeating units of the immiscible first block species; $M_{b2}$ is the number of monomeric repeating units of the miscible second block species and $M_o$ is the number of monomeric repeating units of the crosslinkable material. Suitably, the crosslinkable material comprises about 20% volume fraction of the total mixture.

In the first step of a preferred method of the present invention, the mixture of the block copolymer and the crosslinkable material is coated over the entire surface of the substrate to form a dielectric film by art known techniques such as spin or spray coating, doctor blading or the like. Suitably, prior to coating the surface of the substrate with the mixture, a material to enhance the self-assembly of the block copolymer may be coated onto the substrate. A suitable material is aminopropyltriethoxysilane. Suitably, this material is then annealed under an inert atmosphere. The mixture of the block copolymer and the crosslinkable material is then coated on the substrate. The polymeric film self-assembles on the substrate to form discrete pillars comprising the crosslinkable material and the miscible second block species. The pillars are surrounded by a matrix of the first block species.

In the second step of the method, portions of the dielectric film are removed to expose underlying portions of the substrate using well known lithographic techniques. In one embodiment, portions of the dielectric film are removed by exposing the film to an energy flux of radiation of x-ray, electron beam or ultraviolet. Suitable radiation has a wavelength of less than 254 nm, and preferably less than 200 nm (e.g., 193 nm). Suitable radiation sources are the ArF excimer laser and the KrF excimer laser. The radiation is absorbed by the film and suitably a radiation sensitive acid generator in the film to generate free acid. The exposure to radiation causes crosslinking of the film. The film is then developed to expose portions of the substrate and form the image in the film. The film is developed by art known techniques such as aqueous or organic development. Suitably, the film is exposed to a solvent, suitably an aqueous base such as tetramethyl ammonium hydroxide. The solvent removes the portions of the film which were not exposed to radiation to expose underlying portions of the substrate.

In an alternative second step of the method, after the dielectric film has been coated onto the substrate, the film is crosslinked by art known techniques such as blanket exposure to radiation or thermal crosslinking. Then a photoresist film is coated onto the dielectric film. The photoresist film is then exposed to radiation and developed using known lithographic techniques to expose underlying portions of the dielectric film. Then, using the imaged photoresist film as an etch mask, the structure is etched to expose portions of the substrate.

In the third step of the method, after portions of the substrate have been exposed, a conductive material is coated onto the exposed portions of the substrate by art known techniques such as chemical vapor deposition, ion beam deposition, electroplating or the like.

Optionally, after the film has been exposed to radiation or heat, it can be coated with a permeable capping layer. The capping layer can optionally be porous with interconnecting pores. Suitable materials for the capping layer include a mixture of the block copolymer and the organosilicate with the volume fraction of the second block species and organosilicate being about 70% to form interconnecting pores. Alternatively, a mixture of silsisquioxane such as methyl silsisquioxane with a porogen such as PEO (about 35% volume fraction) form interconnecting pores which will span the thickness of the capping layer. The capping layer can be coated onto the film by art known techniques such as spin coating and the like.

In the last step, the block copolymer is volatilized to form a porous nanostructure comprising an array of discrete pillars. The block copolymer can be volatilized by art known techniques such as heating (e.g., to a temperature of about 350° C. to about 400° C.), heating in combination with exposure to UV radiation, exposure to radiation and ozone, solvent extraction, supercritical fluid extraction or the like. In the final structure, the discrete pillars in the nanostructure are isolated from each other. Further, the individual pillars can have some porosity due to the volatilization of the second block species.

In another preferred method of the present invention, a circuit line is first formed on the substrate by art known techniques. Referring to FIG. 1, in one embodiment of this method, the mixture 2 of a volatilizable block copolymer and a crosslinkable dielectric material of the present invention is coated onto the substrate 4 contiguous to the circuit lines 6 and 7. The mixture self-assembles to phase separate forming a phase 3 of the immiscible first block species (e.g., PS) and a second phase 10 of the miscible second block species (e.g., PEO) and the crosslinkable material. During the self-assembly, the second phase becomes oriented in a generally cylindrical morphology in a matrix of the first phase.

The mixture is then suitably crosslinked to form a solid film 12 between and contiguous to the circuit lines 6 and 7. As shown in FIG. 1, a permeable capping layer 14 can then be (optionally) coated onto the top surface of the film 12. Lastly, in FIG. 1, the block copolymer is volatilized by art known techniques such as heating or heating in combination with blanket exposure to radiation. The volatile components pass through the permeable capping layer to form a dielectric nanostructure under the capping layer. The nanostructure comprises isolated pillars 16 surrounded by air 18. The nanostructure is contiguous to the circuit lines. Alternatively, the dielectric nanostructure can be positioned on top of the circuit lines.

In a second embodiment of this method, the dielectric nanostructure structure is first formed on the entire substrate. Then portions of the nanostructure are removed using lithographic techniques to expose the underlying portions of the substrate. Then conductive material is deposited onto the exposed portions of the substrate to form circuit lines contiguous to the dielectric nanostructure.

In another embodiment of this invention, the nanostructure of the present invention can be formed on a layer of dielectric material. The nanaostructure is then used as an etch mask to transfer the nanostructure pattern into the underlying dielectric layer.

EXAMPLE

A diblock copolymer of polystyrene and poly(ethylene oxide) (PS-b-PEO) with a molecular weight of Mn=34,000 g/mol (PS 32,000 g/mol, PEO 2,000 g/mol) was purchased from Polymer Source, Inc. and used as received. The organosilicate precursor, silsesquioxane (SSQ), is a copolymer of methyl trimethoxy silane and tetraethoxy silane with an approximate molecular weight of 2,000 g/mol. Block copolymer solutions of 1 wt % in toluene were mixed with 1 wt % solutions of SSQ copolymers in propylene glycol propyl ether (PGPE). Thin films were prepared by spin-casting the mixture solutions onto silicon wafers that were cleaned with a UV/ozone cleaner. The surface energy of the native oxide surface of the wafer was modified by coating the surface with dense SSQ followed by UV/ozone treatment. The modified surface has water contact angles of approximately 81 degrees. The spun cast films were annealed under chloroform+octane vapors at room temperature for 10 hrs. After solvent vapor annealing, the wafers were heated to 450 C (5 C/minute) and the temperature was held constant for 2 hours under nitrogen to simultaneously crosslink SSQ and decompose PS-b-PEO.

Figure 2:
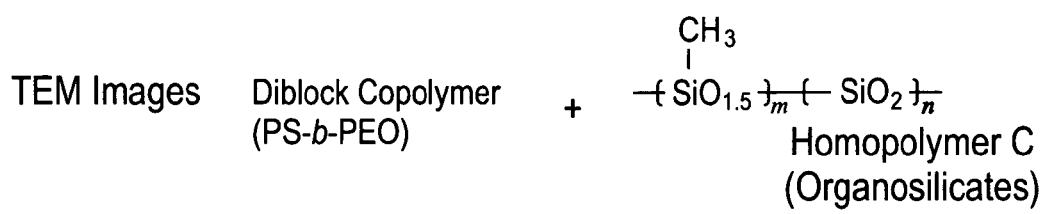
FIG. 2 shows transmission electron microscopy (TEM) images of a structure of the present invention.
Figure 2:
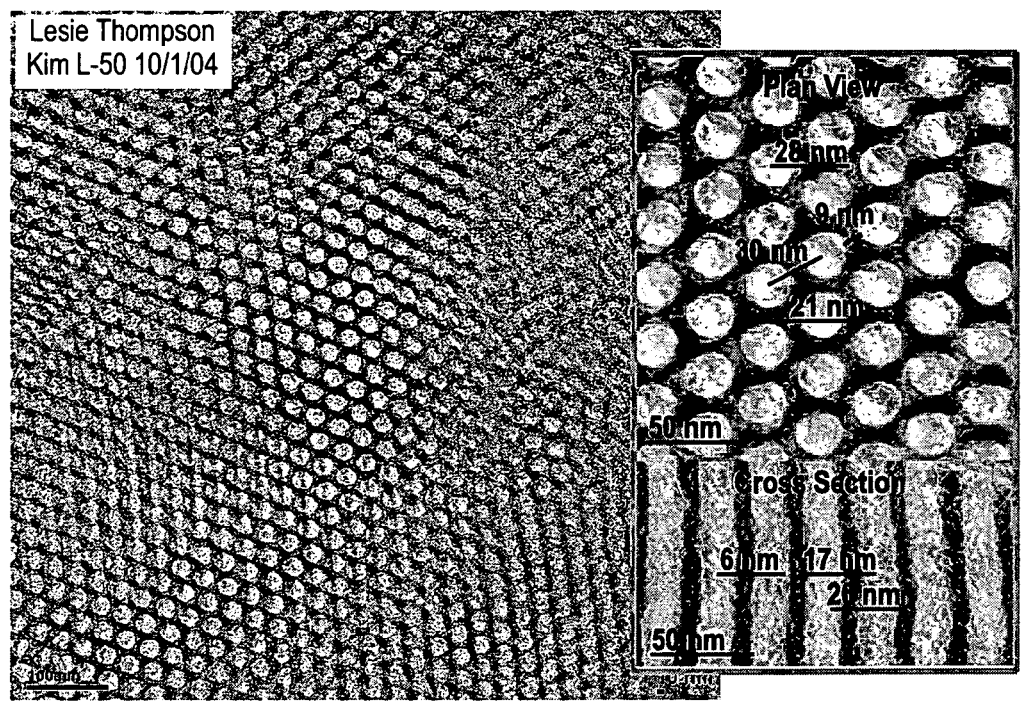
Figure 3:
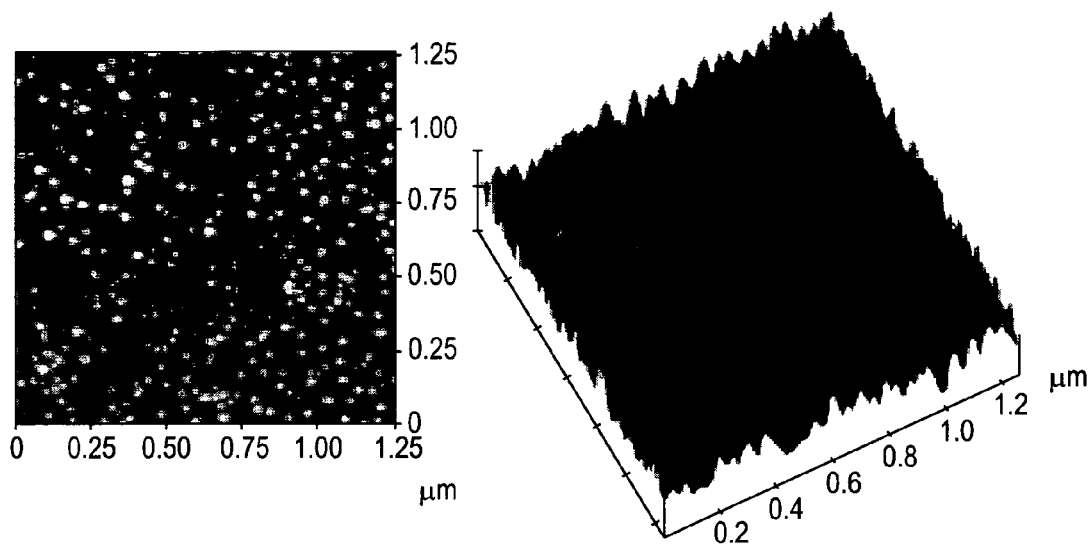
FIG. 3 shows AFM images of a structure of the present invention.
Figure 3:
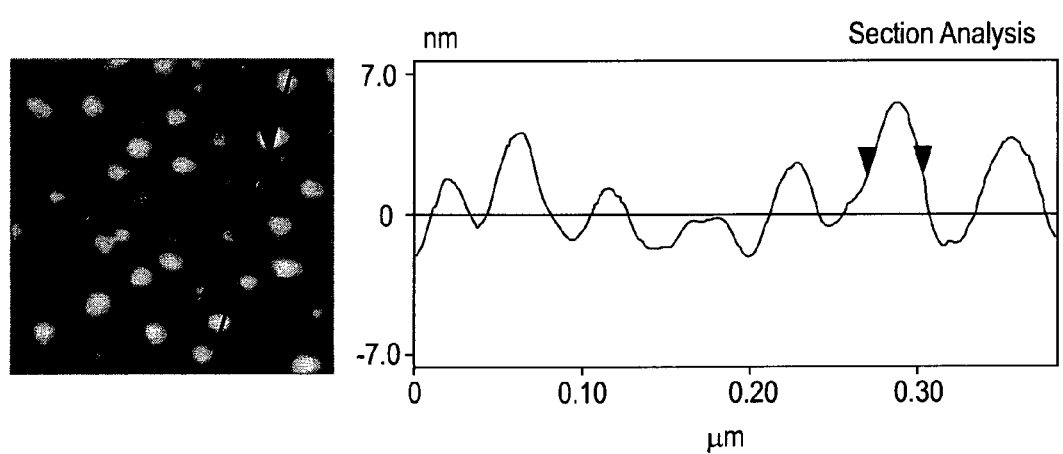

FIG. 2 shows transmission electron microscope images of the structure formed in this example. FIG. 3 shows a height contrasted AFM image of the surface containing nanoposts of 32 nm in diameter. The image was obtained using atomic force microscopy (AFM) in tapping mode using standard silicon cantilevers (Dimension 3100, Digital Instruments). It is clear that nanoposts formed on the surface which were surrounded by air.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Although this invention has been described with respect to specific embodiments, the details thereof are not to be construed as limitations for it will be apparent that various embodiments, changes and modifications may be resorted to without departing from the spirit and scope thereof and it is understood that such equivalent embodiments are intended to be included within the scope of this invention.

The invention claimed is:

1. A method, comprising:
   (a) forming a circuit line on a substrate;
   (b) disposing a dielectric film contiguous to the circuit line, the film comprising a mixture of (i) an amphiphilic volatilizable diblock copolymer comprising a first and a second block species and (ii) a crosslinkable organosilicate dielectric material which is substantially immiscible with the first block species and miscible with the second block species where the volume fraction of the second block species and the crosslinkable material is about 25% to about 35% of the mixture;
   (c) crosslinking the crosslinkable material;
   (d) volatilizing the diblock copolymer to form a nanostructure contiguous to the circuit line, the nanostructure comprising an array of pillars generally vertically positioned on the substrate.

2. The method of claim 1 where the second block species is selected from poly(alkylene oxide), polyethyleneglycol, polypropylene glycol, polyhydroxyalkylmethacrylate, polyalkyleneoxide acrylates, polyalkyleneoxide methacrylates, carbohydrates, polyvinyl alcohol, polyethyleneimines, polyoxazolines, polypeptides, polyvinylpyridines, acrylamides, and N,N-dimethylacrylamides.

3. The method of claim 2 where the second block species includes poly(alkylene oxide).

4. The method of claim 1 where the first block species is selected from polystyrene(PS), poly α-methyl styrene, polynorbonene, polylactones, polylactides, polybutadiene, polyisoprene, polyolefins, and polyisobutylene.

5. The method of claim 1 where the diblock copolymer includes PS and poly(ethyleneoxide).

6. The method of claim 1 where the dielectric crosslinkable material is selected from silsesquioxanes.

7. The method of claim 6 where the crosslinkable material includes a selsesquioxane having the formula $(RSiO_{1.5})_n$, wherein R is selected from the group consisting of a hydrido group and $C_{1-3}$ alkyl group, n is in a range from about 10 to about 500, and the molecular weight is in a range from about 600 to about 30,000.

8. The method of claim 1 where the substrate is coated with coating selected from aminopropyltriethoxysilane and silsesquioxane prior to step (b).

* * * * *